US005973329A

United States Patent [19]

Kim

[11] Patent Number: 5,973,329

[45] Date of Patent: Oct. 26, 1999

[54] ION GENERATING APPARATUS FOR SEMICONDUCTOR MANUFACTURING EQUIPMENT INCLUDING MAGNETIC FIELD SWITCHING APPARATUS

[75] Inventor: Won-ju Kim, Yongin, Rep. of Korea

[73] Assignee: Samsung Electronics Co., Ltd., Rep. of Korea

[21] Appl. No.: 09/062,314

[22] Filed: Apr. 22, 1998

[30] Foreign Application Priority Data

Jun. 2, 1997 [KR] Rep. of Korea ...................... 97-22653

[51] Int. Cl.[6] ...................................................... H01J 37/08

[52] U.S. Cl. ....................... 250/427; 250/423 R; 250/424

[58] Field of Search ............................... 250/427, 423 R, 250/424

[56] References Cited

U.S. PATENT DOCUMENTS 5,189,303 2/1993 Tanjyo et al. ....................... 250/423 R

*Primary Examiner*—Kiet T. Nguyen
*Attorney, Agent, or Firm*—Lappin & Kusmer LLP

[57] ABSTRACT

An ion generating apparatus for semiconductor fabricating equipment includes a device for reversing the orientation of a magnetic field. In this manner, the potential energy of a plurality of filaments in the ion generating apparatus are maintained at a substantially equal level, and consequently, asymmetric damage to one of the plurality of filaments due to concentration and collision of the thermal electrons is prevented, thereby prolonging the maintenance cycle of the ion generating apparatus.

24 Claims, 5 Drawing Sheets

ION GENERATING APPARATUS FOR SEMICONDUCTOR MANUFACTURING EQUIPMENT INCLUDING MAGNETIC FIELD SWITCHING APPARATUS

BACKGROUND OF THE INVENTION

An ion generating apparatus is commonly employed for implantation of ions on a silicon wafer during semiconductor device fabrication. The primary components of an ion generating apparatus include an ion generator 4, an ion selector/deflector 6, and an ion accelerator 8, as illustrated in Prior Art FIG. 1. Control over ion energy levels, reduction of ion implant time, and elimination of ion impurities are primary considerations of such a process.

The ion generator 4 includes a dual head for generating ions, a power supply for supplying power to the dual head to generate thermal electrons, an ion gas source which releases ions when energized by the thermal electrons, and other related components. The amount of ions produced by the ion generator 4 is a function of several variables, including the volume of source gas flow, the degree of thermal electron emission, and the efficiency of the interaction therebetween for ionizing the source gas.

The ion selector/deflector 6 selects ions from those generated by the ion generator 4 and deflects them toward a reaction chamber in which a wafer is loaded. In general, the selection process and deflection process occur contemporaneously.

The ion accelerator 8 propels the selected/deflected ions into the wafer. The level of ion acceleration is determined by the degree of energy required to implant ions to the wafer. The accelerated ions are implanted over an entire surface, or alternatively, a predetermined region, of the wafer.

FIG. 2 is a schematic illustration of an ion generator 4 including a conventional ion generating means referred to in the art as a dual head. The dual head comprises a reaction chamber 10 for generating ions, and electromagnets 20*a*, 20*b* installed on opposite sides of the reaction chamber 10. A common power supply P4 is connected to coils 21*a*, 21*b* winding the electromagnets 20*a*, 20*b*. The electromagnets 20*a*, 20*b* induce a magnetic field 24 having a predetermined intensity inside the reaction chamber 10.

The reaction chamber 10 is an arc chamber, and thus an arc voltage P1 is applied thereto. The reaction chamber 10 includes filaments 12*a*, 12*b* to which external power supplies P2 and P3 are connected. The filaments 12*a*, 12*b* emit thermal electrons 22 which provide the basis for generating ions. The applied external power levels P2 and P3 control the emission of thermal electrons 22. Floating repellers 14*a*, 14*b* are installed on the opposing inner walls of the reaction chamber 10. The repellers 14*a*, 14*b* pass through the walls of the reaction chamber 10 through insulating bodies 16*a*, 16*b*, and guide ions generated in the reaction chamber 10 toward aperture 18 for emission therefrom. The upper ends 13*a*, 13*b* of the filaments 12*a*, 12*b* are disposed between the repellers 14*a*, 14*b*. The reaction chamber 10 is an enclosed chamber with the exception of an ion emission aperture or hole 18 formed in the upper part of the reaction chamber, facing the upper ends of the filaments 12*a*, 12*b*.

When a voltage is applied to the filaments 12*a*, 12*b*, thermal electrons 22 are emitted from the upper ends 13*a*, 13*b*. Thermal electron 22 emissions may be increased or decreased by controlling the applied voltages P2, P3, as described above. Thermal electrons 22 collide with ion generation source gases (not shown) introduced into the reaction chamber 10, whereby the source gases are ionized, forming free ions in the reaction chamber 10. The free ions are guided to the center of the reaction chamber 10 by the repellers 14*a*, 14*b* and exit the reaction chamber 10 through the emission hole 18. The emitted ions 19 are implanted into a wafer via the ion selector/deflector 6 and ion accelerator 8 (see FIG. 1).

The ionization rate of the source gases in the reaction chamber 10 can be increased by raising the applied voltage levels P2, P3 thereby heightening emission activity of thermal electrons. However, this results in increased energy consumption and is generally inefficient. In a more effective technique, the reaction chamber 10 is interposed in a magnetic field 24 generated by electromagnets 20*a*, 20*b*. As a result, when thermal electrons are emitted, they propagate along a spiral path 23 in the magnetic field 24 according to electromagnetism theory. The spiral motion 23 increases the efficiency of ion emission in the reaction chamber by heightening the number of collisions between the thermal electrons 22 and the source gases. However, the increase in efficiency comes at a cost, as the thermal electrons 22 tend to spiral toward one of the electromagnets 20*a*, 20*b*. For example, the thermal electrons 22 are urged toward to the south (S) pole of the electromagnets 20*a*, 20*b*, as electromagnetic forces generated by the electromagnets 20*a*, 20*b* proceed from the north (N) pole to the S pole. As electrons 21 collect at the S pole, the potential energy of the filament 12*a* near the S pole electromagnets 20*a* increases and thus the filament 12*a* near the S pole electromagnet 20*a* emits more thermal electrons than the filament 12*b* near the N pole electromagnet 20*b*. As a result, the repeller 14*a* near the S pole collides with many thermal electrons 25*a*, and a great number of collided thermal electrons 25*b* collide with the filament 12*a* near the S pole. Accordingly, the durability of the filament 12*a* is reduced, and the maintenance or replacement cycle of the ion generation parts is shortened.

SUMMARY OF THE INVENTION

To overcome the above limitations, it is an object of the present invention to provide an apparatus for switching the direction of a magnetic field.

It is a further object of the present invention to provide an ion generating apparatus including the magnetic field direction switching apparatus.

It is still a further object of the present invention to provide an ion forming technique using the ion generating apparatus.

To accomplish the first object, there is provided a magnetic field direction switching apparatus comprising: a current direction switching device; and a magnetic field generating unit connected to the current direction switching device.

According to a first preferred embodiment of the present invention, the current direction switching device comprises: a current direction switching unit, for example a relay; a variable power supply connected to the current direction switching unit; and a magnetic field control signal generating unit.

In a second preferred embodiment, the present invention provides a magnetic field direction switching apparatus comprising a magnetic field generating unit and a rotating device for rotating the magnetic field generating unit. The magnetic field generating unit may comprise an electromagnet or a permanent magnet and the rotating device may comprise a rotation motor.

In a third preferred embodiment, the present invention provides a magnetic field direction switching apparatus comprising a plurality of magnetic field generating units, independent power supply units respectively connected to said plurality of magnetic field generating units, and a current direction switching unit disposed between the magnetic field generating units and the power supplying units.

To accomplish the second object, the present invention provides an ion generating apparatus comprising: a dual head for generating ions; and a magnetic field direction switching apparatus for switching the direction of a magnetic field generated by the dual head.

The magnetic field direction switching apparatus corresponds to the magnetic field direction switching apparatus according to the first to third embodiments of the present invention.

To accomplish the third object, the present invention provides an ion forming method comprising the steps of: (a) generating a magnetic field in an ion reaction chamber using a magnetic field direction switching apparatus; (b) injecting ion formation source gases into the ion reaction chamber; and (c) ionizing the source gases.

According to the embodiments of the present invention, the direction of a magnetic field generated in the ion reaction chamber is switched by providing a control signal to the magnetic field direction switching device.

As described above, the ion generating apparatus in a semiconductor fabricating equipment includes the magnetic field direction switching apparatus for operatively reversing the direction of a magnetic field generated in an ion reaction chamber. The direction of the magnetic field is reversed so as to prevent biasing of the thermal electrons generated in the reaction chamber toward one of the poles of the magnetic field generating means. Accordingly, a precipitous damage on the filament by the thermal electrons is prevented, thereby lengthening the cycle of exchange of ion generating parts.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

Prior Art

Prior Art

DETAILED DESCRIPTION OF PREFERRED EMBODIMENTS

Figure 3:
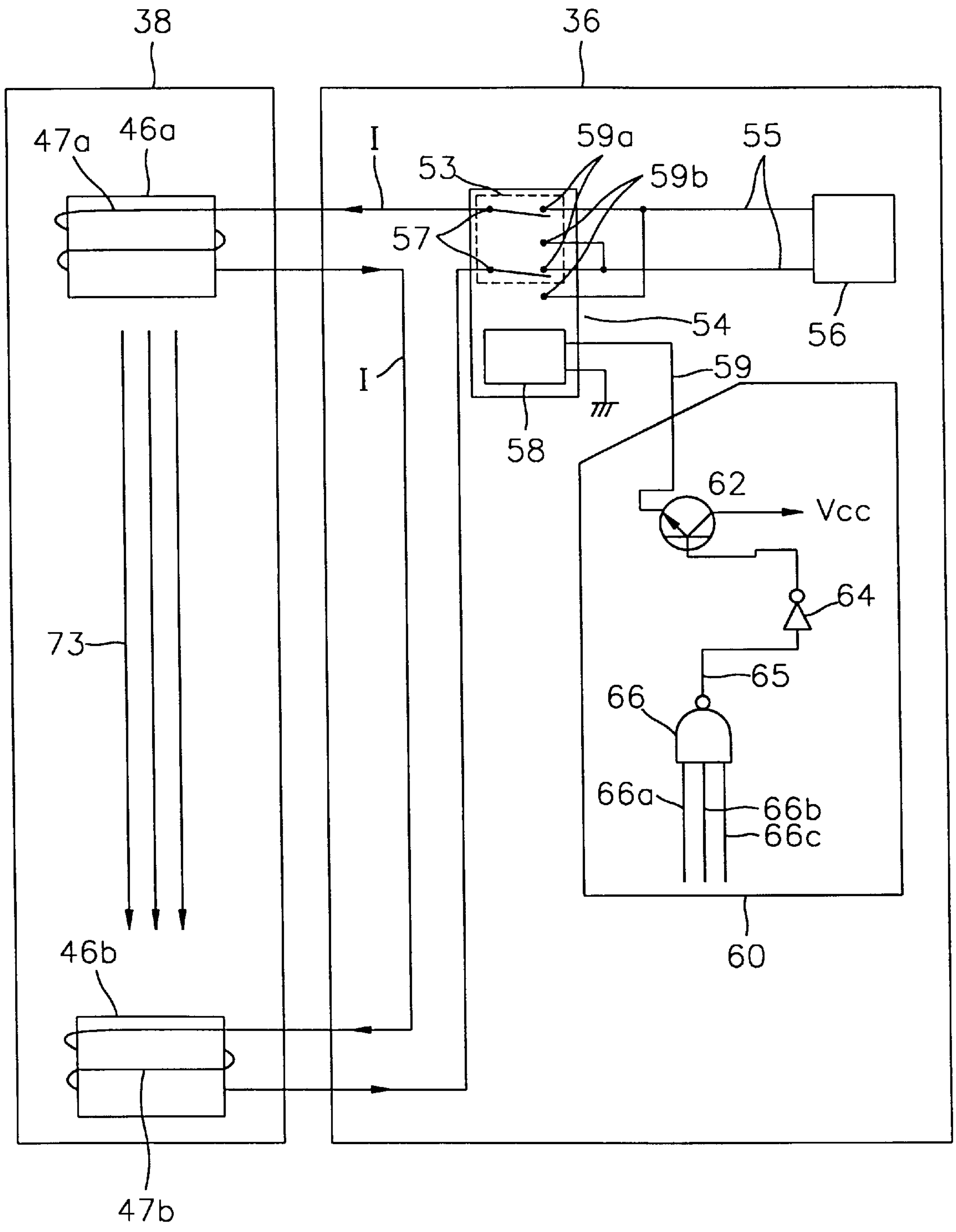
FIG. 3 is a schematic illustration of a magnetic field switching apparatus according to a first preferred embodiment of the present invention.

Referring to FIG. 3, a magnetic field direction switching apparatus according to a first preferred embodiment of the present invention is primarily comprised of a magnetic field direction switching unit 36 and a magnetic field generating unit 38 operatively coupled thereto. The magnetic field direction switching unit 36 includes a current direction switching unit 54, having a power supply unit 56 and a control signal generating unit 60 coupled thereto.

The current direction switching unit 54 preferably comprises a relay including a current switch 53 and a signal input 58. The power supply unit 56 is connected to the current switch 53 for supplying power thereto over lines 55. The control signal generating unit 60 is connected to the signal input 58 and provides a current direction control signal over line 59 to the relay 53 via the signal input 58. The control signal generating unit 60 is preferably comprised of a switch 62, an inverter 64 and a NAND gate 66. The switch 62 preferably comprises a transistor such as a field effect transistor (as shown in FIG. 3) or a bipolar junction transistor. The control signal generating unit 60 can optionally be comprised of a switch 62 and a NAND gate 66 without an inverter 64. The switch 62 shown in FIG. 3 is, by the way of example, an NPN type, and has an emitter connected to the signal input 58, a base connected to the output of the inverter 64 in series, and a collector connected to a Vcc power supply. The switch 62 may alternatively be a PNP type. The output 65 of the NAND gate 66 is connected to the input of the inverter 64 in series.

The NAND gate 66 has a plurality of inputs, for example, first, second and third signal inputs 66*a*, 66*b* and 66*c* respectively. The signal inputs 66*a*, 66*b* and 66*c* receive control signals from a central controller (not shown). The first signal input 66*a* is a terminal input and receives a control signal for determining whether the ion flow reaction chamber is evacuated or in a state of high vacuum. The second signal input 66*b* is a beam gate input and receives a control indicating whether the beam gate of an ion generating apparatus is opened or closed. The third signal input 66*c* is connected to a variable timer which cycles the switching of the magnetic field direction generated by the magnetic field generating unit 38, for example a cycle ranging from 0 to 8 hours. The current switch 53 is activated/deactivated, i.e. toggled, according to the output of the NAND gate 66 (AND gate, in the case where the inverter 64 is not included) signals 66*a*, 66*b* and 66*c*.

The magnetic field generating unit 38 includes a plurality of electromagnets, for example, first and second electromagnets 46*a*, 46*b* wound by coils 47*a*, 47*b*. In the magnetic field generating unit 38, the first electromagnet 46*a* may operate as a north (N) pole, and the second electromagnet 46*b* may operate as a south (S) pole, and vice versa. A current I generated at the power supply unit 56 is provided through the coils 47*a*, 47*b* to the first and second electromagnets 46*a*, 46*b* in a direction determined by current direction switching unit 54, in turn determining the direction of field 73.

The power supply unit 56 is in connection with the first and second electromagnets 46*a*, 46*b* via the current direction switching unit 54. Current output by a first terminal 57 of the current switch 53 flows through coils 47*a*, 47*b*. If the current I flows firstly into the first electromagnet 46*a*, that current continues through the input of the second electromagnet 46*b* and flows out from the output thereof. Thereafter, the current returns into the variable power supply unit 56 through the second terminal 57 of the current switch 53. The flow of current described above can be reversed by switching the contact point 59*a* of the current switch 53 to a different contact point 59*b*.

Figure 4:
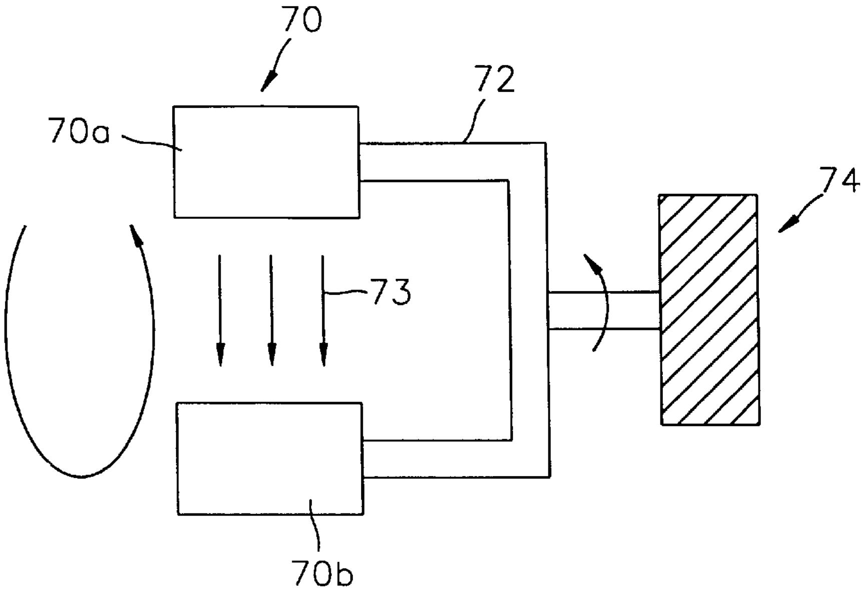
FIG. 4 is a schematic illustration of a magnetic field switching apparatus according to a second preferred embodiment of the present invention.

Referring to FIG. 4, a magnetic field direction switching apparatus according to a second preferred embodiment of the present invention includes a magnetic field generating unit 70 and a rotating unit 74, for example a motor, coupled via shaft 72, for rotating the magnetic field generating unit 70. The magnetic field generating unit 70 may comprise electromagnets, as described above, or may comprise permanent magnets. Assuming that electromagnets 70*a*, 70*b* are used, they may be connected to a common power supply (not shown) or respectively to separate power supplies. When the magnetic field generating unit 70 is rotated according to a predetermined cycle, a magnetic field 73 is generated in a manner that is similar to that obtained by the magnetic field direction switching apparatus according the first preferred embodiment. The rotating unit 74 preferably comprises a rotary motor capable of rotating in both directions within a predetermined cycle time. The rotating unit 74 may comprise any of a number of means feasible for rotating the magnetic field generating unit 70 in conformity with the predetermined cycle.

Figure 5:
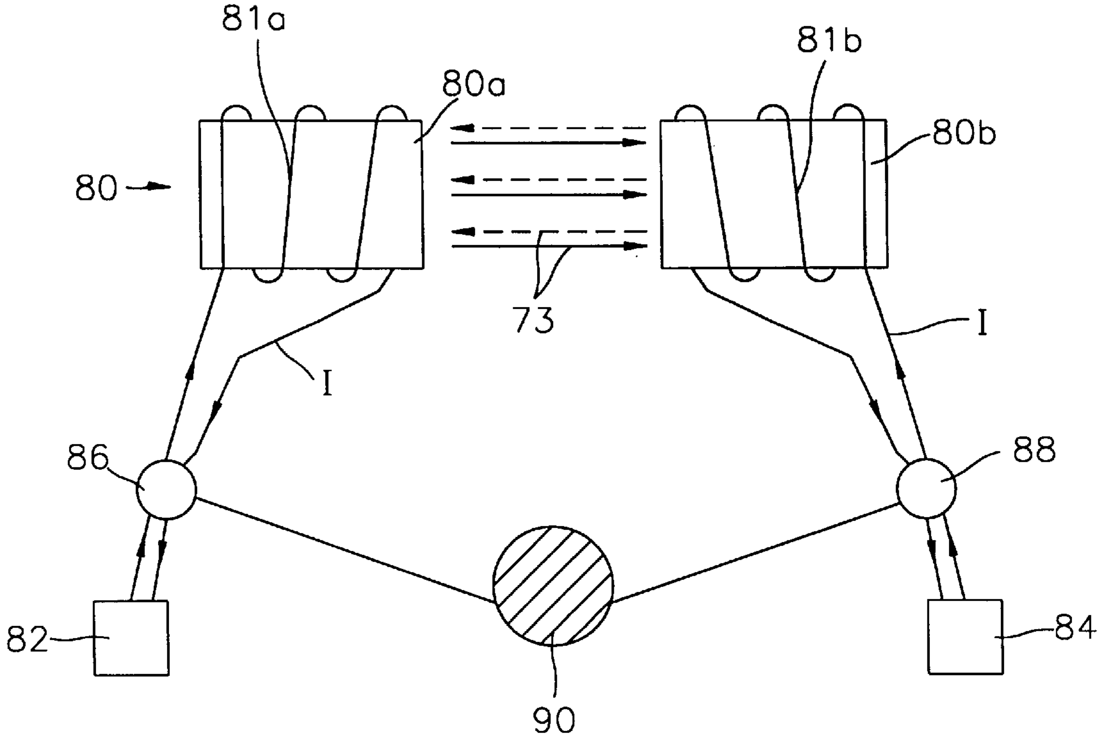
FIG. 5 is a schematic illustration of a magnetic field switching apparatus according to a third preferred embodiment of the present invention.

Referring to FIG. 5, a magnetic field direction switching apparatus according to a third preferred embodiment of the present invention includes a plurality of magnetic field generating units 80, for example electromagnets 80*a*, 80*b* wound by coils 81*a*, 81*b* and first and second power supply units 82, 84 respectively coupled thereto. First and second current direction switching units 86, 88 are interposed between the magnetic field generating units 80 and the power supply units 82, 84, respectively. The first and second current direction switching units 86, 88 provide a switching function similar to the current direction switching unit 54, that is, a relay, in the first embodiment, as they control the direction of current I provided to each of the electromagnets 80*a*, 80*b*. A synchronizing unit 90 ensures that the first and second current direction switching units 86 and 88 are switched simultaneously. For this purpose, the first and second current direction switching units 86 and 88 further include a synchronizing unit 90.

Hereinbelow, an ion generating apparatus for semiconductor fabricating equipment according to the present invention, i.e., an ion generating apparatus including the magnetic field direction switching apparatus according to the first preferred embodiment, will be described. Note that the second and third preferred embodiments described above are equally applicable to the ion generating apparatus of the present invention.

Figure 6:
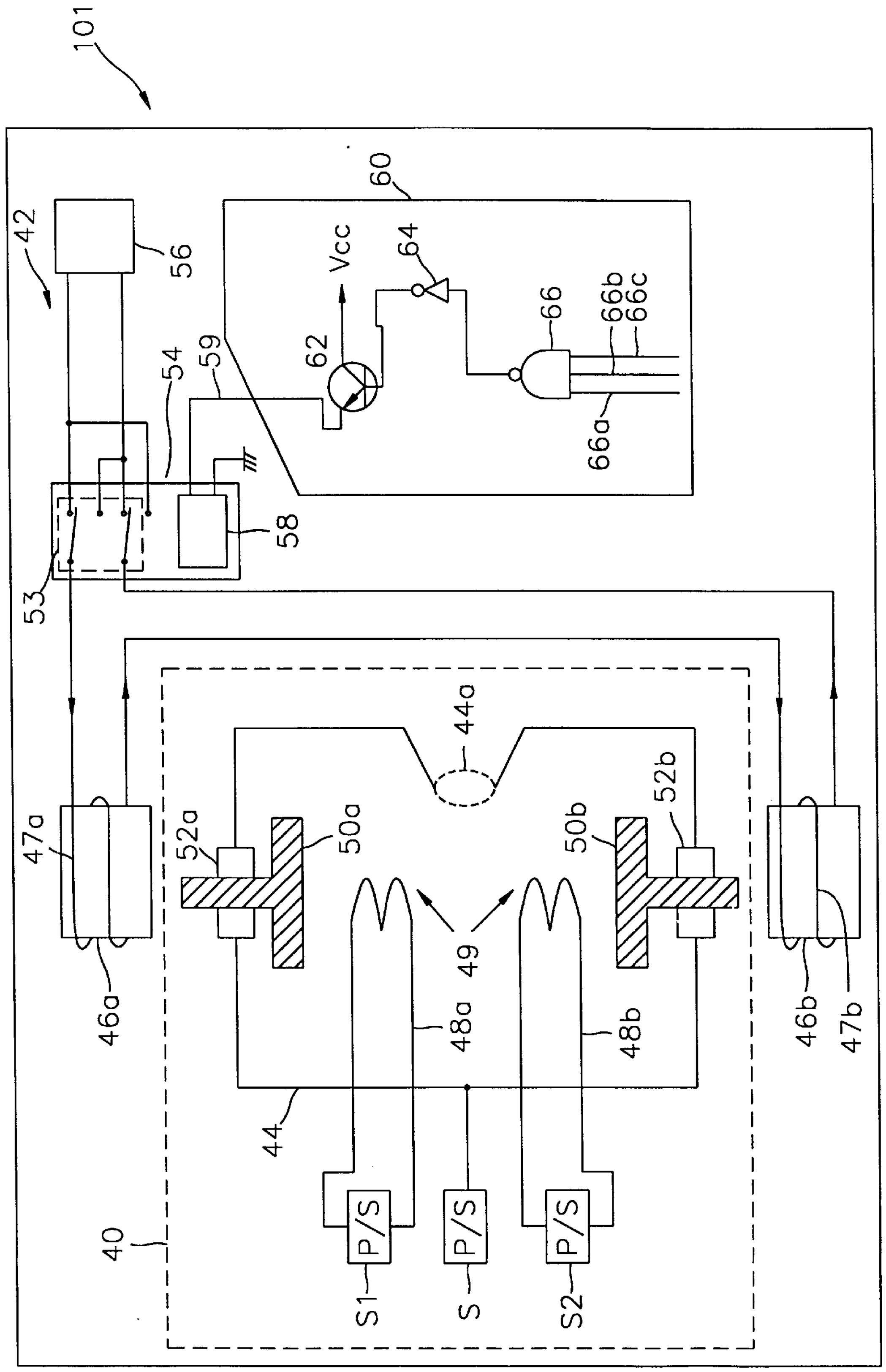
FIG. 6 is a schematic illustration of an ion generating apparatus including the magnetic field switching apparatus according to the first embodiment of the present invention.

Referring to FIG. 6, the ion generating apparatus 101 is divided into a dual head 40 and a magnetic field direction switching apparatus 42 as described above with reference to FIG.3.

The dual head 40 includes an ion reaction chamber 44 including a thermal electron emission unit 48*a*, 48*b*. The ion reaction chamber 44 is interposed between the first and second electromagnets 46*a*, 46*b* which are the magnetic field generating unit of the magnetic field direction switching apparatus 42. The ion reaction chamber 44 is preferably an arc chamber, connected to a first external power supply (S). The first power supply (S) is a variable power supply, which provides a voltage, for example 70 V to 100 V, to the ion reaction chamber 44. The ion reaction chamber 44 includes a plurality of filaments, for example, first and second filaments 48*a*, 48*b*. The filaments 48*a*, 48*b* are isolated from each other by a predetermined distance, and are connected to second and third power supplies S1, S2 which are preferably variable power supplies. The first and second filaments 48*a*, 48*b* emit thermal electrons which, upon reaction with an ionizing gas (not shown) in the reaction chamber, generate ions. The degree of thermal electron emission is determined by the voltage S1, S2 applied to the first and second filaments 48*a*, 48*b*. The coils 47*a*, 47*b* winding the electromagnets 46*a*, 46*b* are connected to the power supply 56 of the magnetic field direction switching apparatus 42. Accordingly, a uniform magnetic field having a constant intensity is generated in the ion reaction chamber 44 between the first and second electromagnets 46*a*, 46*b*.

The ion reaction chamber 44 includes a plurality of floating repellers, 50*a*, 50*b* installed on the inner walls thereof. The floating repellers shown 50*a*, 50*b* are opposite to each other with the ends 49 of the first and second filaments 48*a*, 48*b* therebetween. The repellers 50*a*, 50*b* direct ions generated in the ion reaction chamber 44 toward its center. The repellers 50*a*, 50*b* may be charged or in a neutral state as shown. The floating repellers 50*a*, 50*b* extend to the outside of the ion reaction chamber 44 through first and second insulators 52*a*, 52*b* installed in the wall of the reaction chamber 44. In this manner, the floating repellers 50*a*, 50*b* are insulated from the ion reaction chamber 44 to which the arc voltage is applied. The ion reaction chamber 44 includes an ion emitting hole 44*a* formed in a portion of the reaction chamber 44 facing to the upper ends 49 of the first and second filaments 48*a*, 48*b*. The reaction chamber 44 is substantially enclosed, with the exception of the emission hole 44*a*.

The ion generating apparatus 101 may alternatively include the magnetic field direction switching apparatus according to the second or third preferred embodiments of the present invention described above.

An ion forming method using the ion generating apparatus including the magnetic field direction switching apparatus according to the present invention will now be described in detail.

Figure 1:
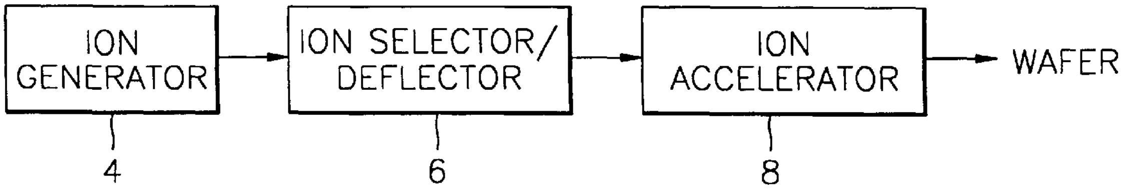
FIG. 1 (PRIOR ART)
FIG. 1 is a block diagram of the components of an ion implanting apparatus in conventional semiconductor device fabricating equipment.
Figure 2:
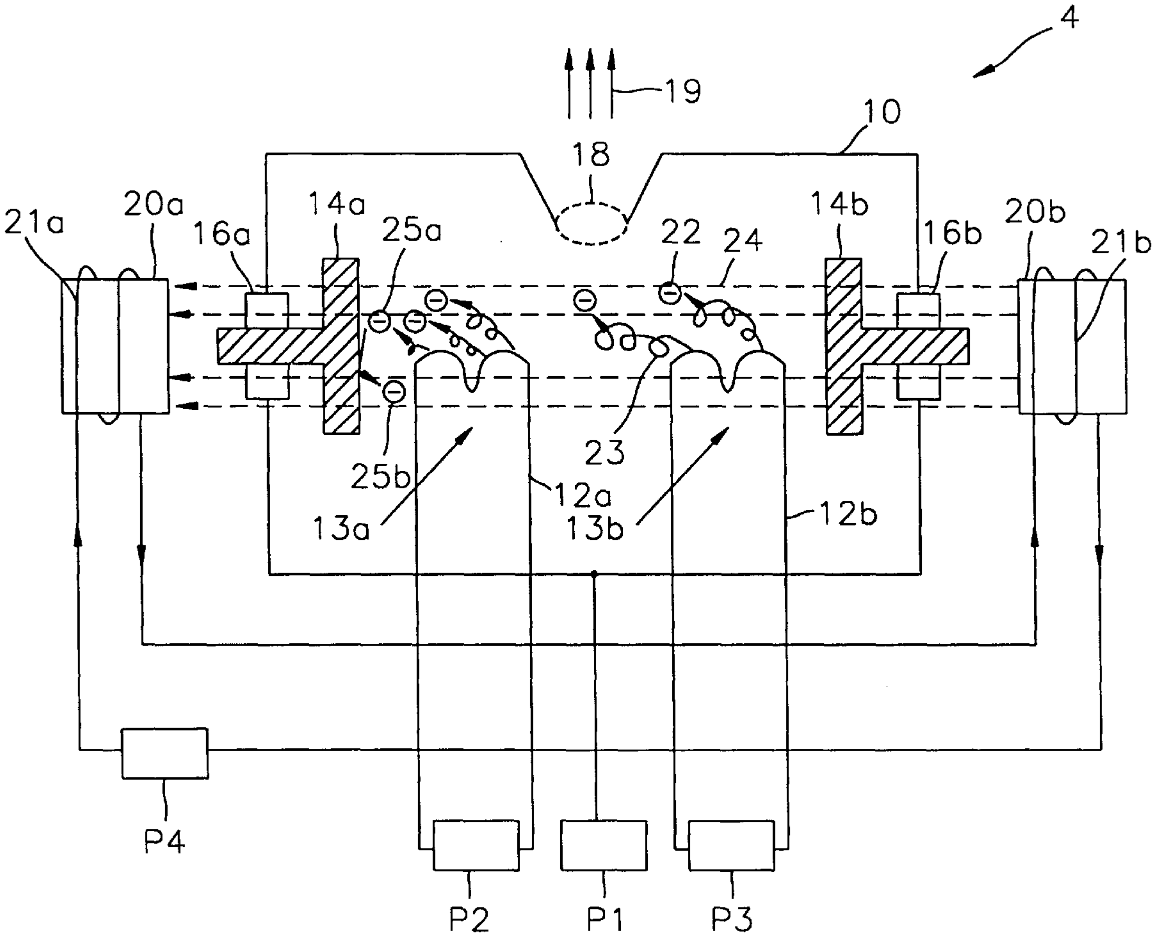
FIG. 2 (PRIOR ART)
FIG. 2 is a schematic illustration of a conventional ion generating apparatus.
Figure 7:
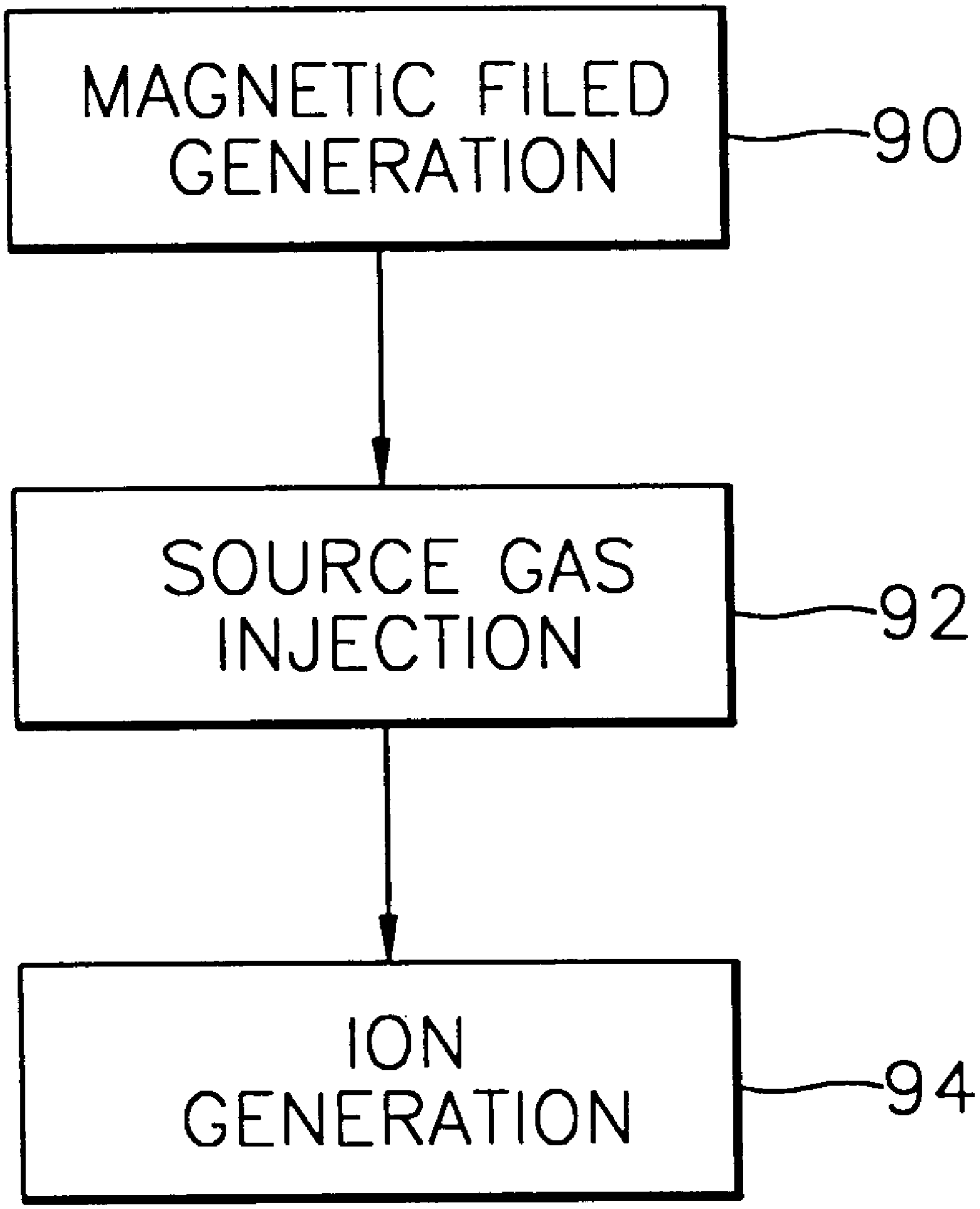
FIG. 7 is a block diagram of the steps of an ion generating method according to the present invention.

Referring to FIGS. 6 and 7, the ion forming method of the present invention includes the steps 90, 92 and 94 of generating a magnetic field in the ion reaction chamber 44, implanting a source gas into the reaction chamber 44 to form ions, and ionizing the source gas. Referring to FIG. 6, when a voltage is applied to the first and second filaments 48*a*, 48*b* thermal electrons (not shown) are emitted from the upper ends 49 of the two filaments 48*a*, 48*b*. Thermal electron emission levels can be increased or decreased by controlling the applied voltage S1, S2. The thermal electrons collide with source gases (not shown) provided in the reaction chamber 44. The ions are guided toward the center of the reaction chamber 44 by the first and second repellers 50*a*, 50*b* and escape the reaction chamber 44 via the emission hole 44*a*. Those ions used for implantation are selected and deflected to a direction where a wafer is loaded, by the ion selector/deflector 6 (see FIG. 1). The ions are accelerated to energies suitable for implantation by the ion accelerating unit 6. In this manner, the ions are implanted into the wafer.

A magnetic field is generated in the reaction chamber 44 by the first and second electromagnets 46*a*, 46*b* in line with the repellers 50*a*, 50*b* and the filaments 48*a*, 48*b*. Accordingly, the thermal electrons generated by the filaments 48*a*, 48*b* make a spiral motion in the magnetic field as described above with reference to FIG. 1. This, in turn, enhances the number of source gas collisions, thereby increasing an ionization rate of the source gases. Therefore, the generation of ions in the reaction chamber 44 is enhanced.

The operation of the magnetic field direction switching apparatus 42 will now be described.

In a preferred embodiment, the magnetic field in the ion reaction chamber 44 maintains a constant intensity. Thus, depending on the orientation of the field, one of the filaments 48*a*, 48*b* faces the situation as indicated in the conventional art. That is, the filament closest to the S pole magnet is damaged faster than the filament closest to the N pole. In order to prevent this problem, in the present invention, the direction of the magnetic field is periodically or nonperiodically switched during the ion generating process. The orientation of the magnetic field is controlled by reversing the direction of current flowing through the first and second electromagnets 46*a*, 46*b* as described above. The frequency of switching is determined by a signal 59 generated at the control signal generating unit 60.

In a first embodiment, the control signal generating unit 60 comprises a transistor 62, an inverter 64 and a NAND gate 66. In this case, if control signals are provided to the inputs 66*a*, 66*b* and 66*c* of the NAND gate 66, the result is provided to the inverter 64 and then the inverted signal is input to the base of the transistor 62. The signal input to the transistor 62 is amplified and provided to the signal input 58 of the relay, and then the current switch 53 begins to operate. For example, when signals input to the first to third inputs 66*a*, 66*b* and 66*c* are all logic "1", the transistor is activated to operate the current direction switching unit 54. However, in case that the transistor 59 is a PNP type, the above situation is reversed.

As a result, the direction of the current flowing in the first and second electromagnets 46*a*, 46*b* is reversed and direction of the magnetic field is reversed accordingly.

A signal associated with the internal pressure state of the reaction chamber into which ions are implanted indicating whether the pressure of the reaction chamber for ion-implantation is evacuated or in a high vacuum is provided to the first input 66*a*. The second input 66*b* receives a signal indicating whether the beam gate of the ion generating apparatus is closed or open. The third input 66*c* receives a switch cycle of the magnetic field direction.

In order to switch the direction of the magnetic field using the magnetic field direction switching apparatus 42, it is preferable that the pressure of the reaction chamber for ion-implantation is in a high vacuum state, and that the beam gate is closed. If the direction of the magnetic field in the ion reaction chamber 44 is switched when the reaction chamber is not in the high vacuum state and the beam gate is open, the density of generated ions is changed which can have a negative influence on the ion implanting process. Accordingly, when the reaction chamber is in a high vacuum state and the beam gate is closed, a signal "1", i.e., a signal representing "switch the current switch 53" should be generated by the output of the inverter 64 in order to switch the direction of the magnetic field. In this example, "1" corresponds to the case when the reaction chamber is in a high vacuum state, and "0" corresponds to the other case. A "1" corresponds to the case when the beam gate is closed, and "0" corresponds to an open gate. "0" corresponds to the case when a variable timer value input to the third input 66*c* has counted down to 0, and "1" corresponds to an active count. The variable timer value input to the third input 66*c* determines the switching cycle of the magnetic field direction within the range of time, for example 0 to 8 hours as described above. That is, when the signal "1" is input to the first and second inputs 66*a*, 66*b* and the signal "1" is input to the third input 66*c* by setting the variable timer value as 2 hours, the output of the inverter 64 outputs the signal "1" and the current switch 53 is thus switched. However, since the variable timer value is set as 2 hours, the current switch 53 is switched every two hours in a state where the reaction chamber is in high vacuum and the beam gate is closed, and the direction of the magnetic field is reversed.

In a second embodiment, when the control signal generating unit 60 is comprised of a transistor and a NAND gate (without an inverter 64) as the second case, a signal output by the output terminal of the NAND gate determines the state of the current switch. In this case, when the signal output of the NAND gate is "0", the direction of magnetic field is switched. Accordingly, in each case, when the pressure of the reaction chamber into which ions are implanted is a high vacuum, when the beam gate is closed, and when the time value of the variable timer is not zero, the output corresponds to a signal "1". Also, when the switching cycle of the magnetic field direction is set as, for example, 2 hours, the signal "1" is input to the third input 66*c*. Therefore, a signal corresponding to (1,1,1) is input to the first to third inputs 66*a*, 66*c* and 66*c* of the NAND gate, and the signal "0" is output to the output of the NAND gate. Accordingly, the current switch 53 is switched every two hours, so that the direction of the magnetic field is switched. As described above, it is preferable that the switch of the direction of the magnetic field is made in conditions that the ion implantation reaction chamber maintains a high vacuum state and the beam gate is closed. Thus, an identical signal value, i.e., (1,1) or (0,0) is always input to the respective first and second inputs 66*a*, 66*b* of the NAND gate. Therefore, when the signal value "0" is input to the third input 66*c*, the direction of magnetic field is not switched, regardless of the values of input to the first and second signal inputs 66*a*, 66*b*.

The direction of the magnetic field generated in the reaction chamber 44 can be switched at any time by changing the variable timer value within a range, for example between 0 and 8 hours.

As the direction of the magnetic field generated in the ion reaction chamber 44 is switched periodically or nonperiodically, the thermal electrons can be prevented from being biased toward one of the electromagnets 46*a*, 46*b*. Consequently, over time, the thermal electrons are uniformly distributed about the ion reaction chamber 44 between the first and second filaments 48*a*, 48*b* without excessive, long term concentration near one of the floating repellers 50*a*, 50*b*. In this manner, the ionization of the source gases occurs uniformly around the first and second filaments 48*a*, 48*b* of the ion reaction chamber 44. Further, the repellers 50*a*, 50*b* are maintained in a sound state without destruction of insulation from the ion reaction chamber 44.

A permanent magnet can optionally be used as the magnetic field generating unit in a rotation configuration as described above with reference to FIG. 4. The rotation cycle of the permanent magnet can be determined arbitrarily.

The magnetic field direction switching apparatus 42 is an independent apparatus, not limited to application in the ion generating apparatus. For instance, the current direction switching apparatus can be included in equipment requiring a unit for changing the direction of a current flowing into or flowing out of a specific device (not necessarily electromagnets) depending on external conditions. In this case, the magnetic field direction switching apparatus controls the flow direction of the current rather than changing the direction of a magnetic field.

As described above, the ion generating apparatus according to the present invention includes a magnetic field direction switching apparatus which can reverse the orientation of a magnetic field generated in the ion reaction chamber. The magnetic field direction switching apparatus periodically or nonperiodically reverses the direction of the magnetic field generated in the reaction chamber, thereby preventing thermal electrons generated in the reaction chamber from being biased toward one side of magnetic field generating units. Accordingly, the thermal electrons are uniformly distributed around the filaments, so that an asymmetrical filament damage, where one filament is more intensively damaged than the other, is less likely to occur. Thus, the maintenance cycle of the ion generating unit can be prolonged.

While this invention has been particularly shown and described with references to preferred embodiments thereof, it will be understood by those skilled in the art that various changes in form and details may be made therein without departing from the spirit and scope of the invention as defined by the appended claims.

I claim:

1. An ion generating apparatus comprising:

an ion source for generating ions;

a magnetic field source for generating an oriented magnetic field incident on said ion source to enhance ionization of said ions; and switching means for reversing the orientation of said magnetic field.

2. The apparatus of claim 1 wherein the ion source comprises a dual head.

3. The apparatus of claim 2 wherein the dual head comprises:

a ionization gas source; and at least one thermal electron emitter for generating thermal electrons reactive with said gas for generating ions.

4. The apparatus of claim 1 wherein said magnetic field source comprises at least one permanent magnet.

5. The apparatus of claim 4 further comprising a rotating unit for rotating the position of the permanent magnet.

6. The apparatus of claim 1 wherein said magnetic field source comprises at least one electromagnet.

7. The apparatus of claim 1 wherein said switching means comprises:

a current direction switching unit;

a variable power supply operatively coupled to said current direction switching unit; and a magnetic field control signal generating unit.

8. The apparatus of claim 7 wherein said current direction switching unit comprises a relay.

9. The apparatus of claim 7 wherein said magnetic field control signal generating unit comprises a switch and a NAND gate receiving feedback signals corresponding to the vacuum condition of the ion source, the position of a beam gate coupled to the ion source, and the state of a variable timer for timing cycle time of the switching means.

10. The apparatus of claim 9 wherein the cycle time is variable between 0 and 8 hours.

11. The apparatus of claim 1 wherein said switching means comprises:

a plurality of magnetic field generating units;

a plurality of variable power supplies coupled to said magnetic field generating units;

a plurality of current direction switching units interposed between said plurality of magnetic field generating units and said plurality of variable power supplies; and a synchronizing unit operatively coupled to said current direction switching unit.

12. The apparatus of claim 11 wherein said plurality of magnetic field generating units comprise first and second electromagnets.

13. A method for generating ions comprising:

generating ions at an ion source;

providing an oriented magnetic field incident on said ion source to enhance ionization of said ions; and selectively reversing the orientation of said magnetic field.

14. The method of claim 13 wherein the ion source comprises a dual head.

15. The method of claim 14 wherein the dual head comprises:

a ionization gas source; and at least one thermal electron emitter for generating thermal electrons reactive with said gas for generating ions.

16. The method of claim 13 wherein said magnetic field source comprises at least one permanent magnet.

17. The method of claim 16 further comprising rotating the position of the permanent magnet with a rotating unit.

18. The method of claim 13 wherein said magnetic field source comprises at least one electromagnet.

19. The method of claim 13 wherein said switching means comprises:

a current direction switching unit;

a variable power supply operatively coupled to said current direction switching unit; and a magnetic field control signal generating unit.

20. The method of claim 19 wherein said current direction switching unit comprises a relay.

21. The method of claim 19 wherein said magnetic field control signal generating unit comprises a switch and a NAND gate receiving feedback signals corresponding to the vacuum condition of the ion source, the position of a beam gate coupled to the ion source, and the state of a variable timer for timing cycle time of the switching means.

22. The method of claim 21 wherein the cycle time is variable between 0 and 8 hours.

23. The method of claim 13 wherein said switching means comprises:

a plurality of magnetic field generating units;

a plurality of variable power supplies coupled to said magnetic field generating units;

a plurality of current direction switching units interposed between said plurality of magnetic field generating units and said plurality of variable power supplies; and a synchronizing unit operatively coupled to said current direction switching unit.

24. The method of claim 23 wherein said plurality of magnetic field generating units comprise first and second electromagnets.

* * * * *